(12) United States Patent
Niebojewski

(10) Patent No.: US 12,532,521 B2
(45) Date of Patent: Jan. 20, 2026

(54) METHOD FOR MANUFACTURING SELF-ALIGNED EXCHANGE GATES AND ASSOCIATED SEMICONDUCTING DEVICE

(71) Applicant: COMMISSARIAT À L'ÉNERGIE ATOMIQUE ET AUX ÉNERGIES ALTERNATIVES, Paris (FR)

(72) Inventor: Heimanu Niebojewski, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 871 days.

(21) Appl. No.: 17/577,769

(22) Filed: Jan. 18, 2022

(65) Prior Publication Data

US 2022/0231132 A1    Jul. 21, 2022

(30) Foreign Application Priority Data

Jan. 18, 2021   (FR) ...................................... 2100439

(51) Int. Cl.
- H10D 64/01 (2025.01)
- H10D 30/01 (2025.01)
- H10D 48/00 (2025.01)

(52) U.S. Cl.
CPC ........... *H10D 64/01* (2025.01); *H10D 30/023* (2025.01); *H10D 48/383* (2025.01); *H10D 64/015* (2025.01); *H10D 64/017* (2025.01)

(58) Field of Classification Search
CPC .... H10D 64/01; H10D 48/383; H10D 64/017; H10D 30/023; H10D 64/015
See application file for complete search history.

(56) References Cited

U.S. PATENT DOCUMENTS

| | | | |
|---|---|---|---|
| 9,842,921 B2 | 12/2017 | Eriksson et al. | |
| 2019/0043952 A1* | 2/2019 | Thomas | ............... H10D 30/794 |
| 2019/0043989 A1 | 2/2019 | Thomas et al. | |
| 2019/0130298 A1 | 5/2019 | Pioro-Ladriere et al. | |

FOREIGN PATENT DOCUMENTS

| | | |
|---|---|---|
| FR | 3 081 155 A1 | 11/2019 |
| WO | WO 2017/213658 A1 | 12/2017 |
| WO | WO 2018/063170 A1 | 4/2018 |

OTHER PUBLICATIONS

Search Report as issued in French Patent Application No. 2100439, dated Sep. 20, 2021.

* cited by examiner

*Primary Examiner* — Joshua Benitez Rosario
*Assistant Examiner* — Christopher A Culbert
(74) *Attorney, Agent, or Firm* — Pillsbury Winthrop Shaw Pittman LLP

(57) ABSTRACT

A method manufactures exchange gates from a starting structure including a substrate and, disposed on the substrate, a plurality of gate stacks, each gate stack including, a layer of a conductive or semiconductor material and a layer of a hard mask.

10 Claims, 13 Drawing Sheets

[Fig. 1]
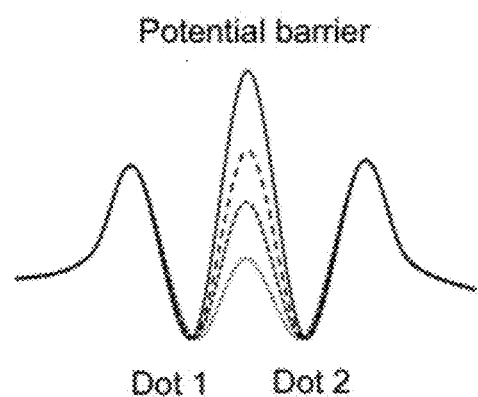
[Fig. 2A]
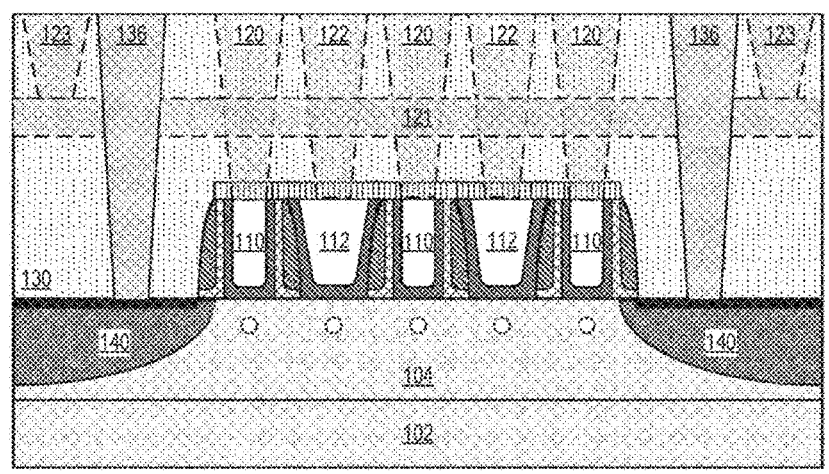
[Fig. 2B]
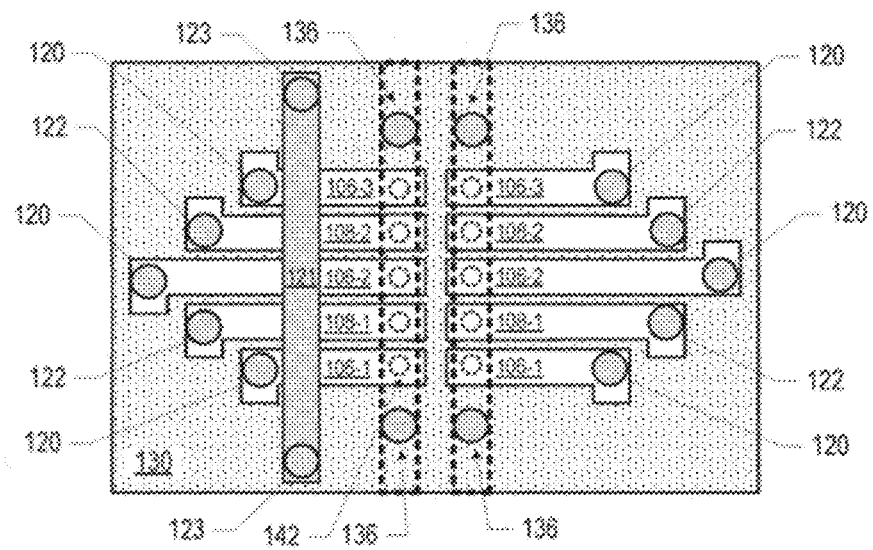

[Fig. 3]
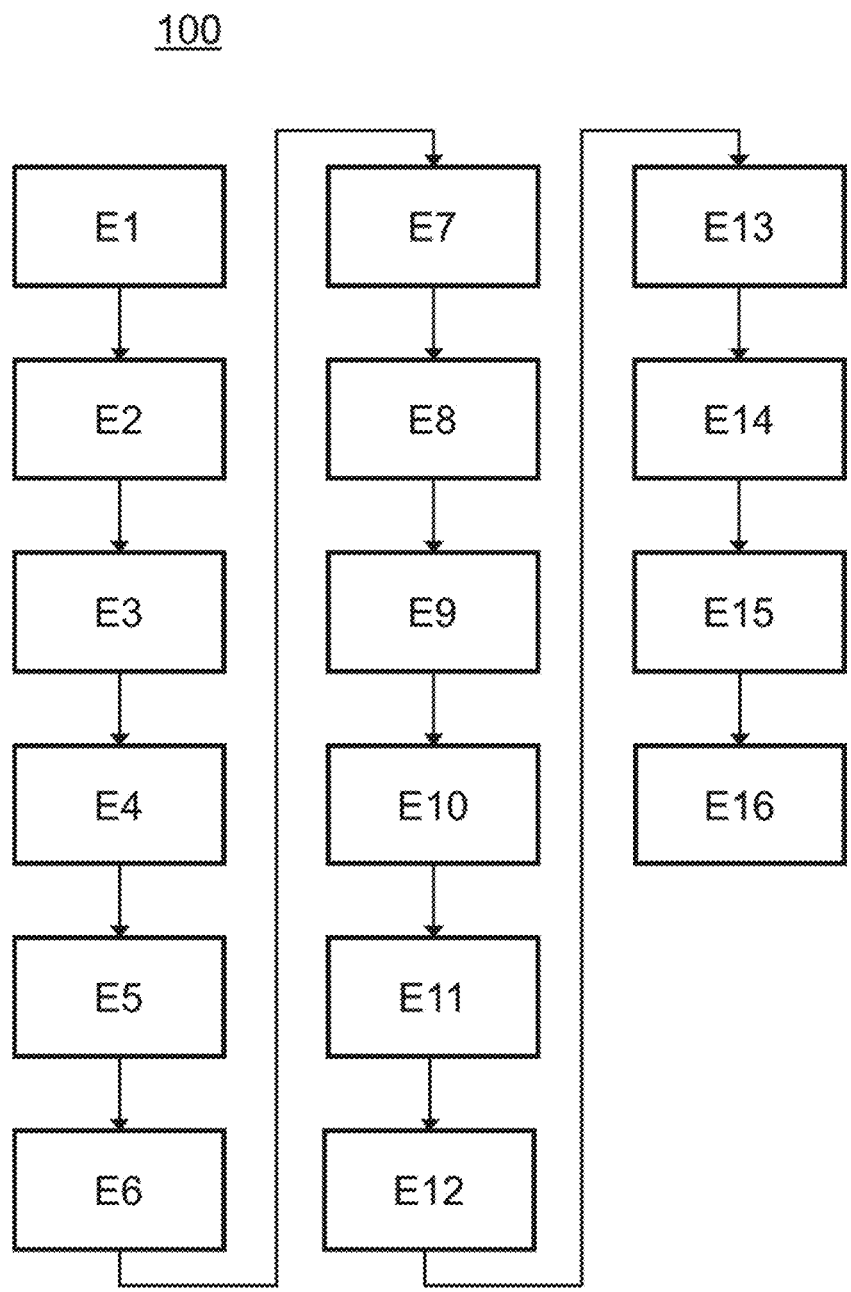

[Fig. 4]
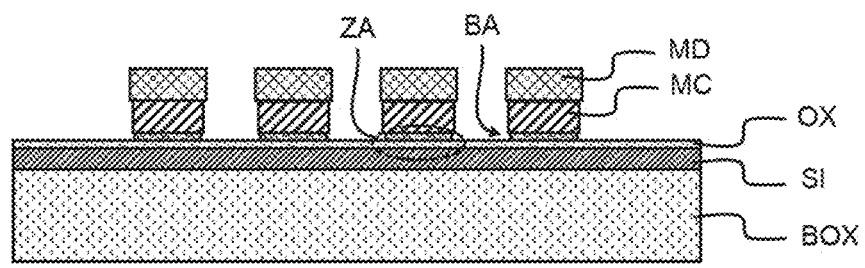
[Fig. 5]
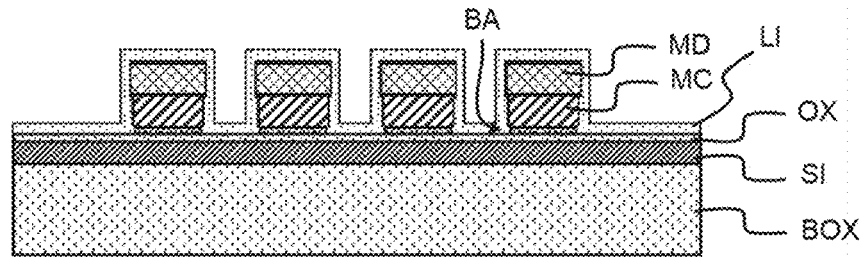

[Fig. 6]
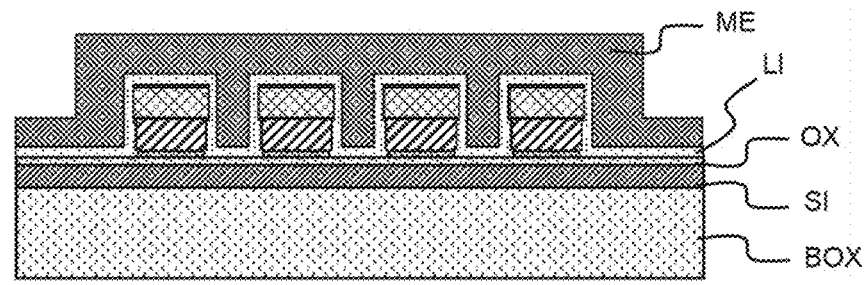
[Fig. 7]
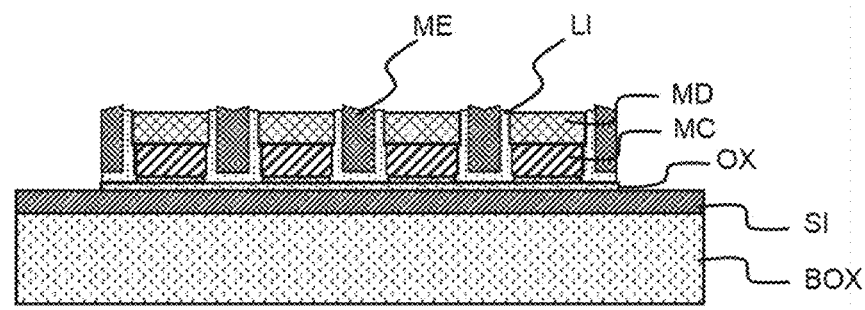

[Fig. 8]
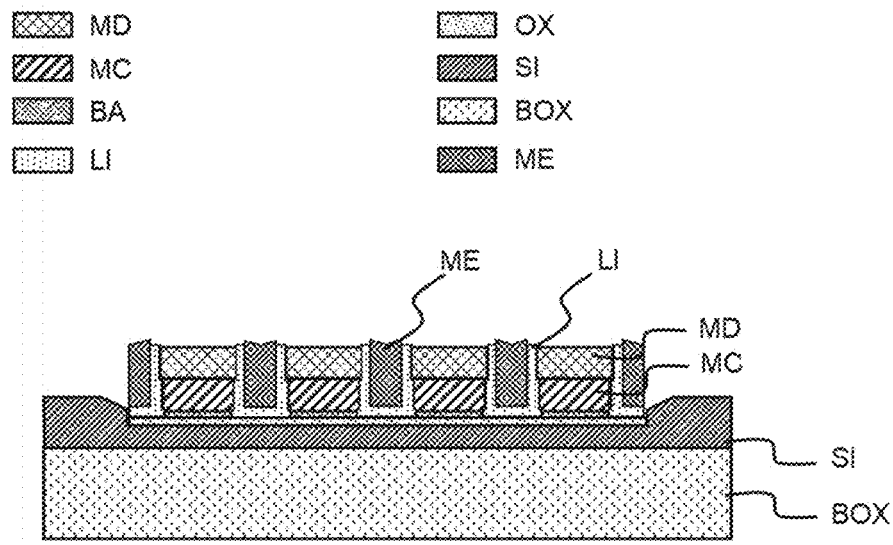
[Fig. 9]
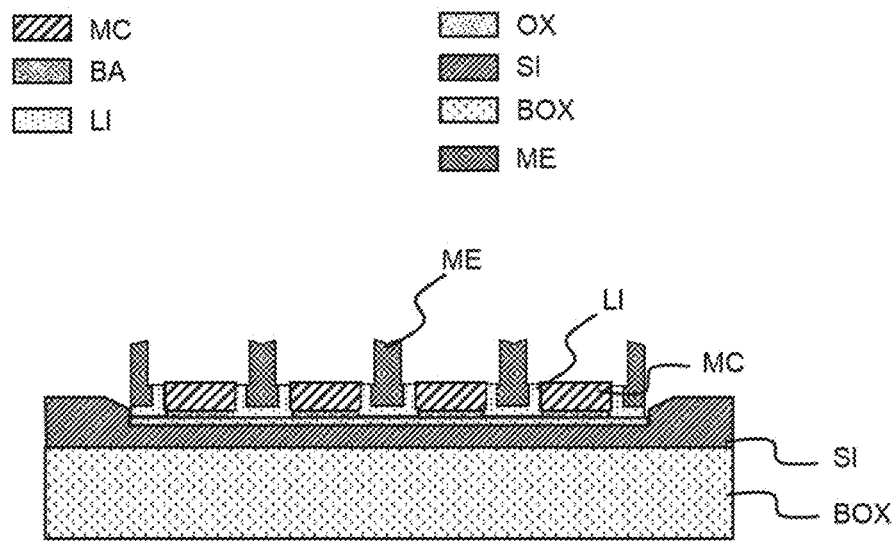

[Fig. 10]
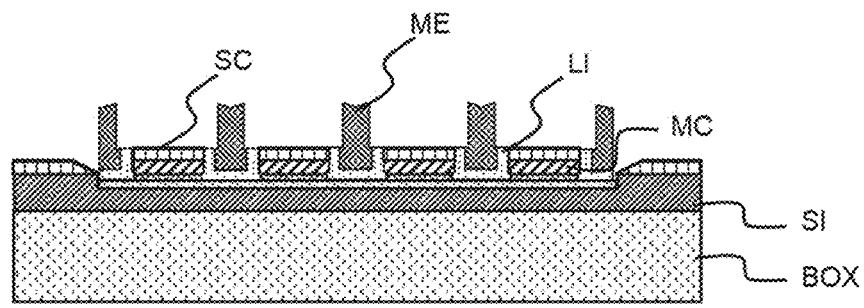
[Fig. 11]
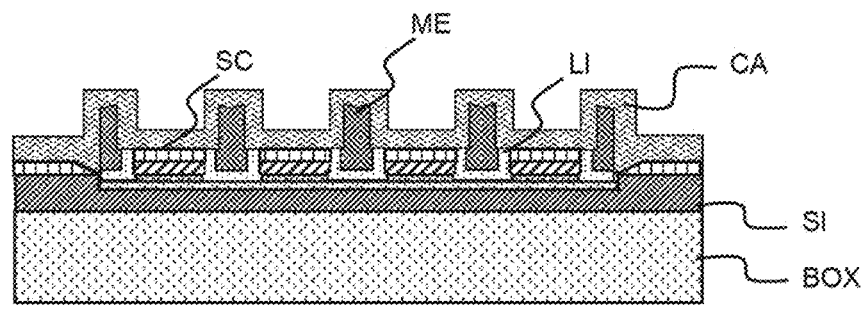

[Fig. 12]
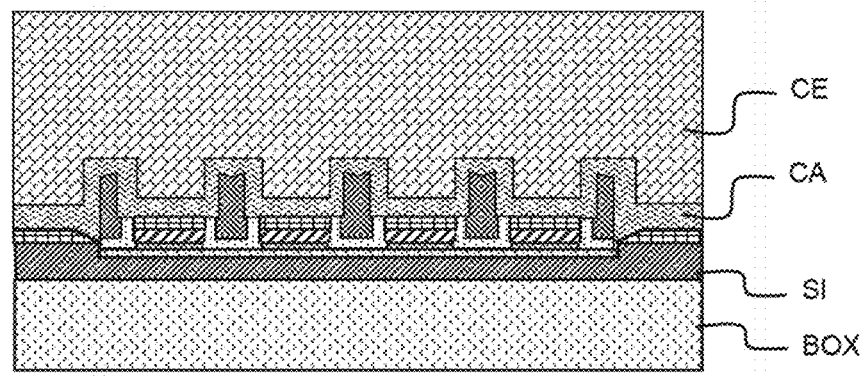
[Fig. 13]
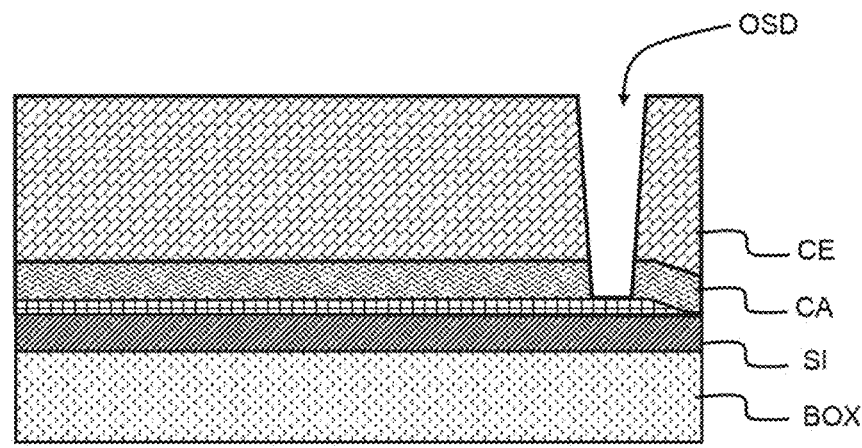

[Fig. 14A]
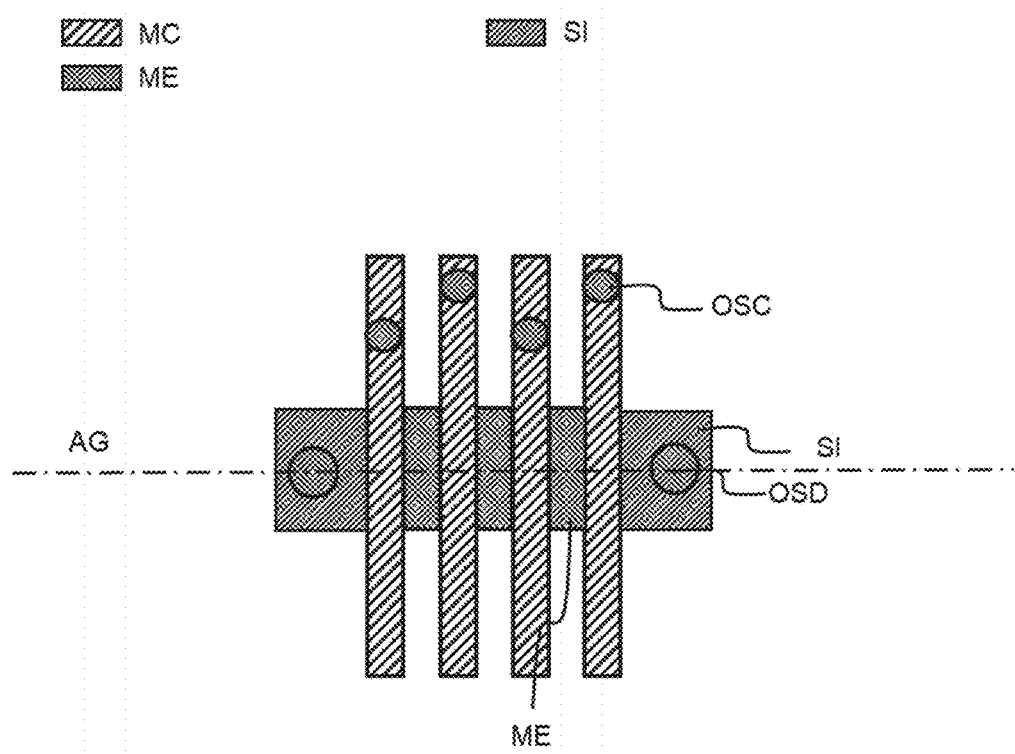

[Fig. 14B]
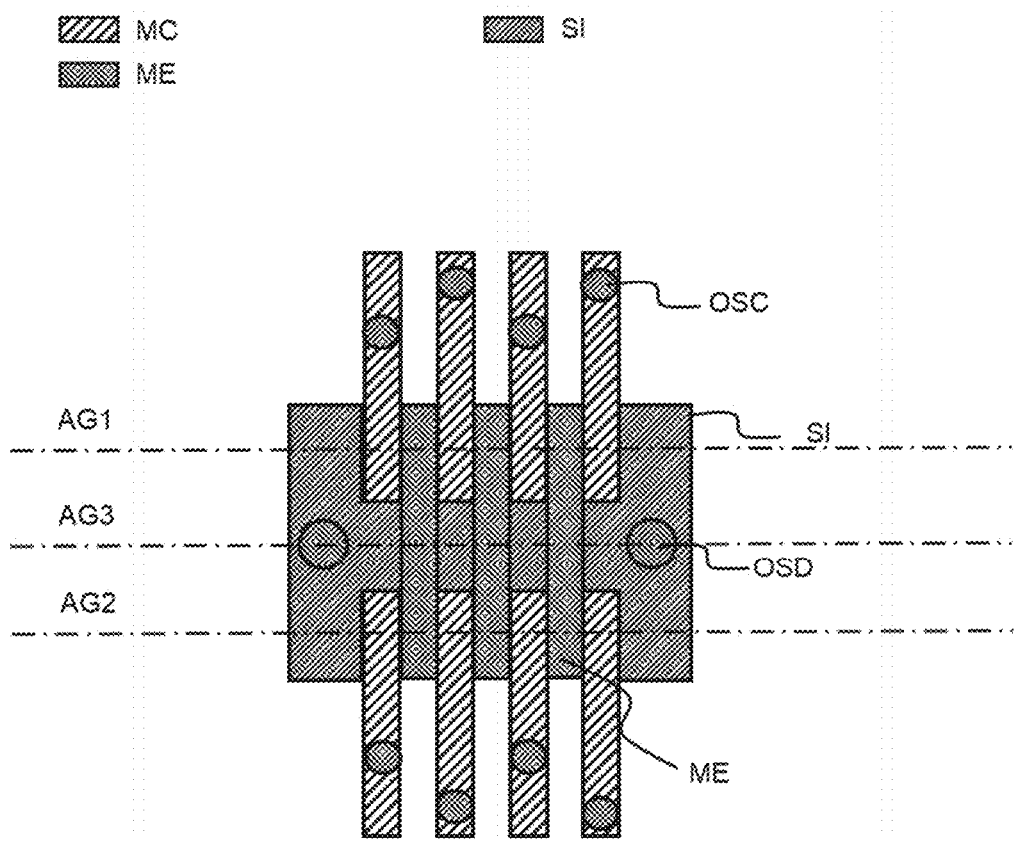
[Fig. 15A]
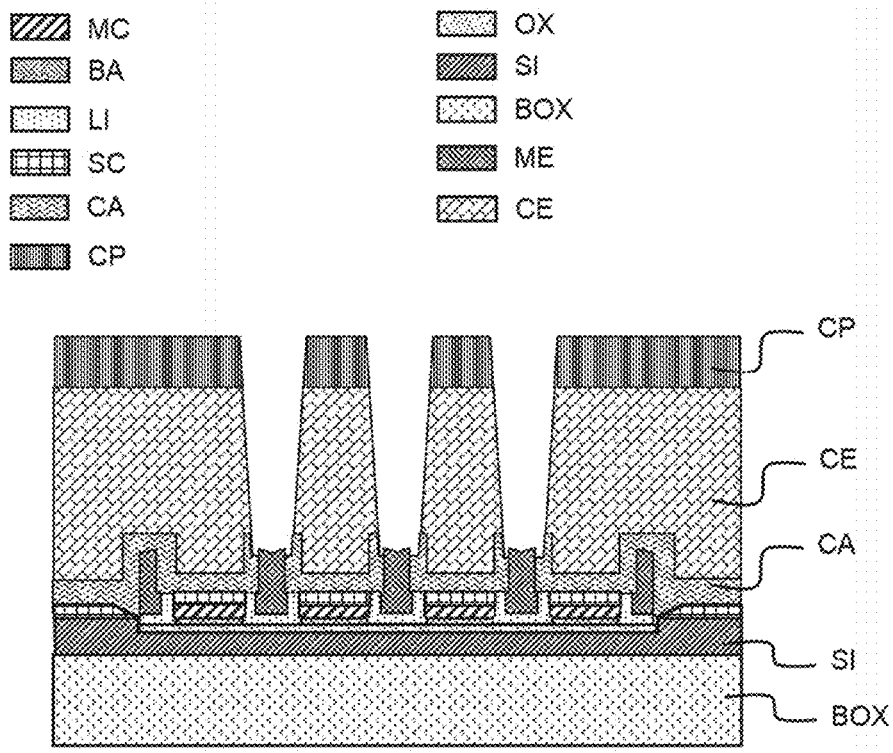

[Fig. 15B]
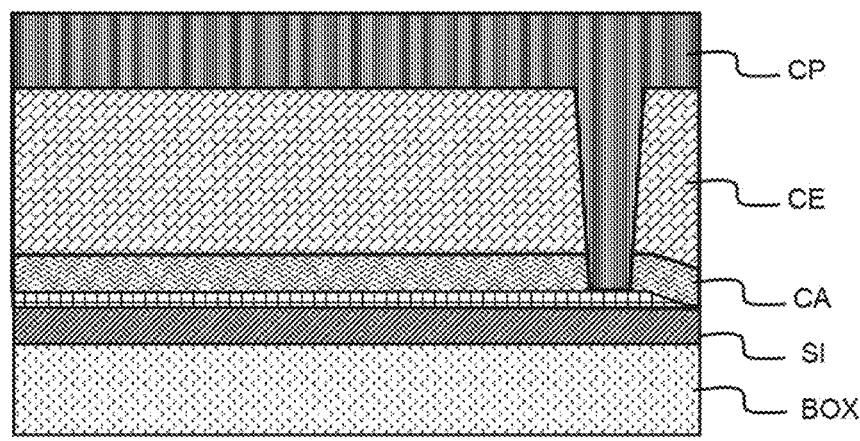
[Fig. 16]
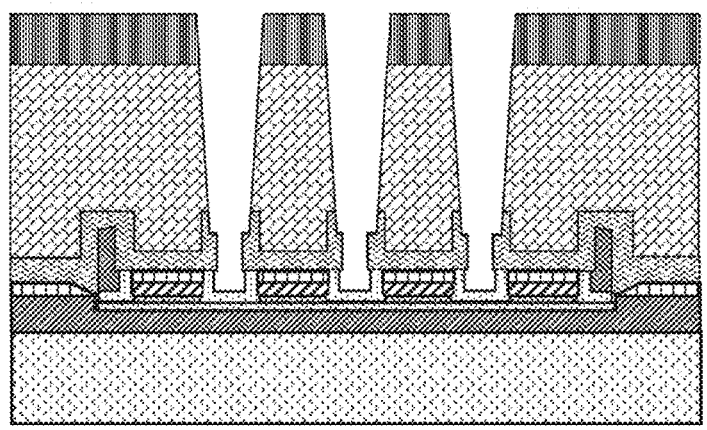

[Fig. 17A]
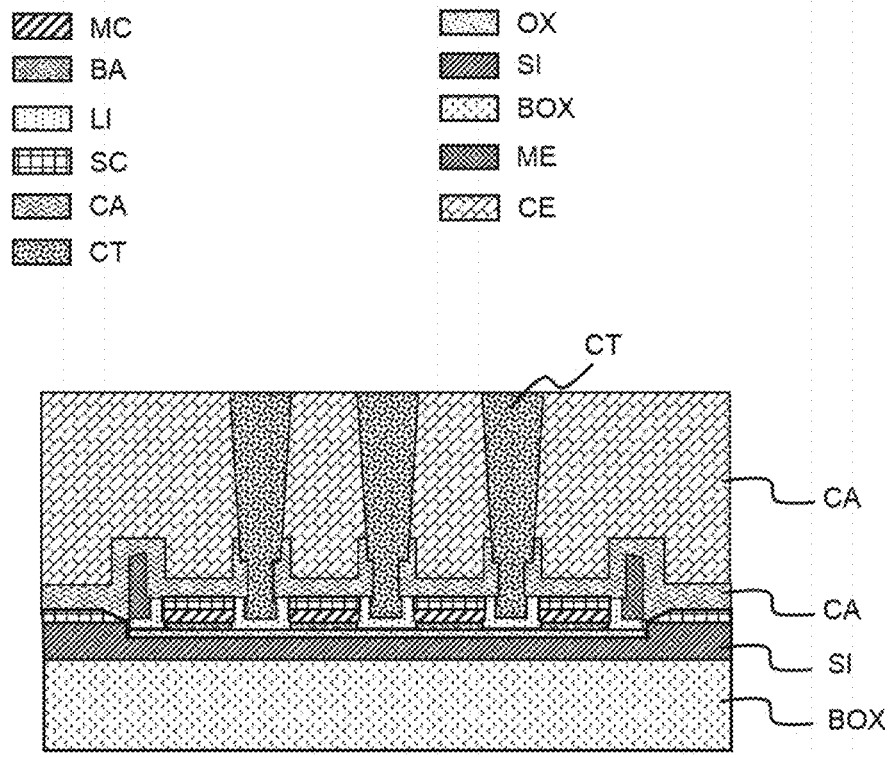
[Fig. 17B]
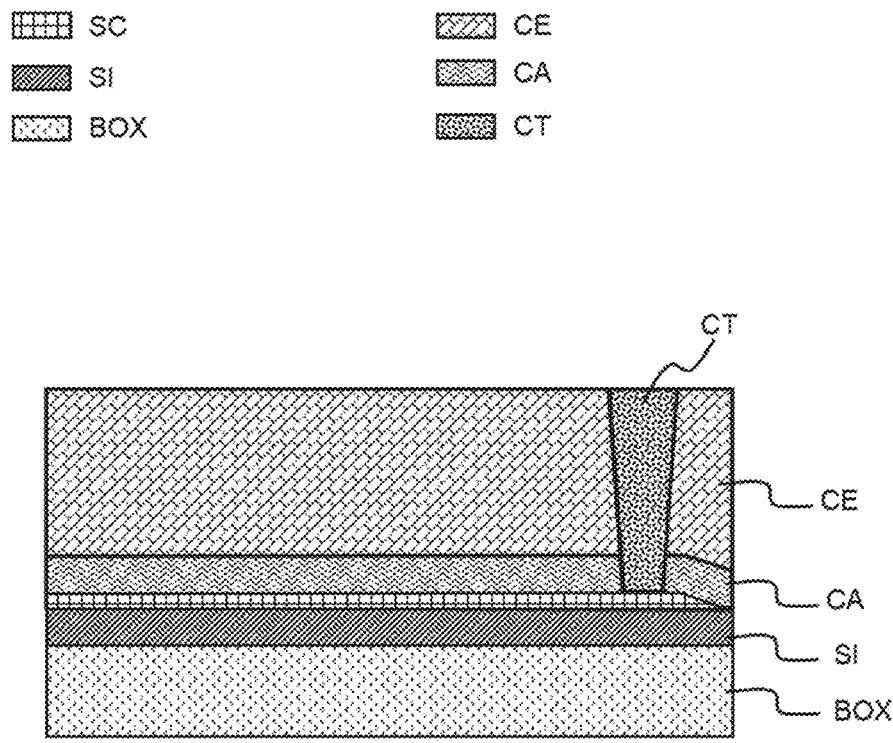

[Fig. 18]
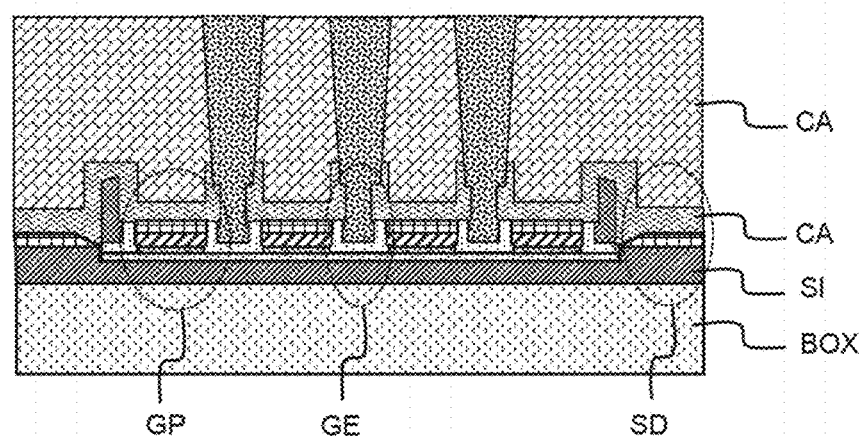
[Fig. 19A]
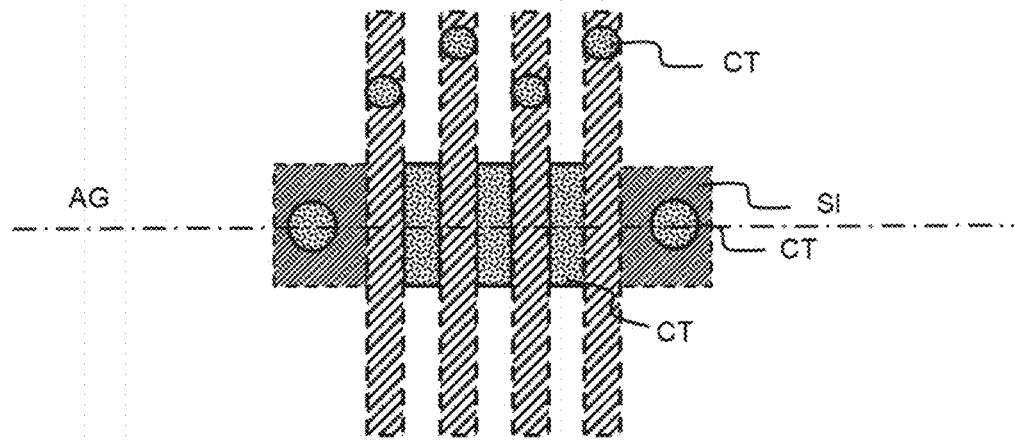

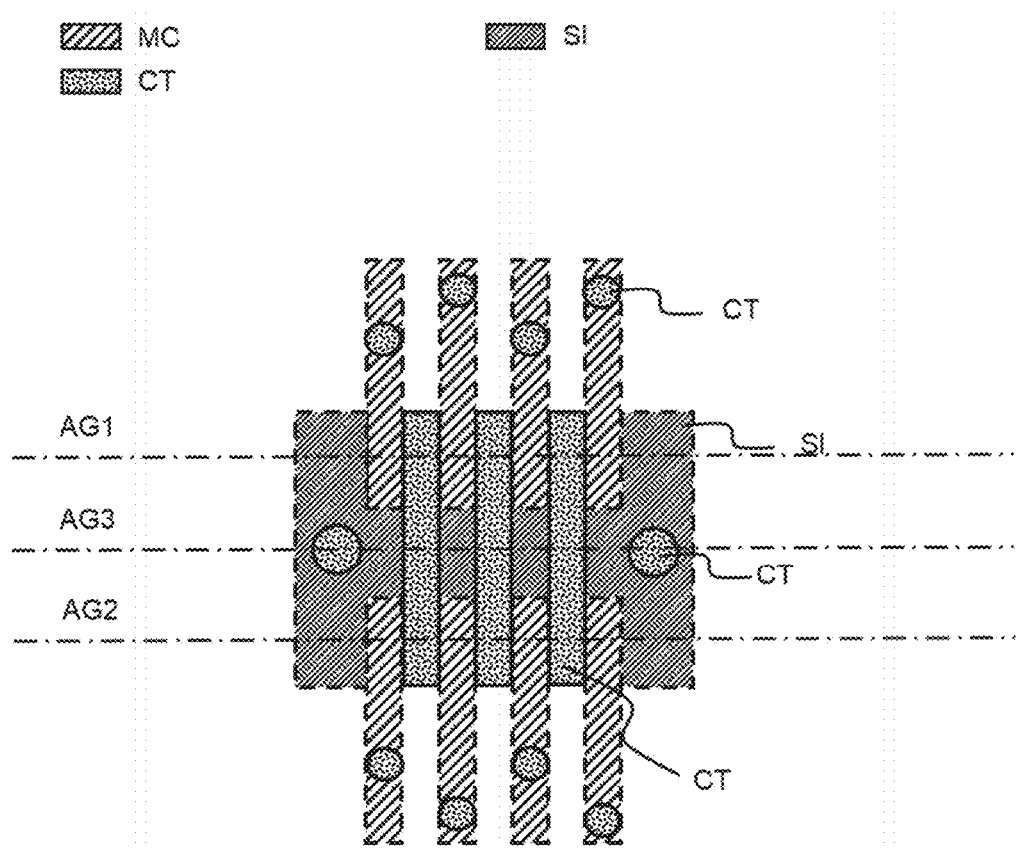
[Fig. 19B]

METHOD FOR MANUFACTURING SELF-ALIGNED EXCHANGE GATES AND ASSOCIATED SEMICONDUCTING DEVICE

CROSS-REFERENCE TO RELATED APPLICATIONS

This application claims priority to French Patent Application No. 2100439, filed Jan. 18, 2021, the entire content of which is incorporated herein by reference in its entirety.

TECHNICAL FIELD OF THE INVENTION

The technical field of the invention is that of the manufacture of semiconducting devices.

The present invention relates to the manufacture of exchange gates and in particular to a method for manufacturing self-aligned exchange gates for applications in quantum computing.

TECHNOLOGICAL BACKGROUND OF THE INVENTION

In the field of quantum computing, it is common to confine one or more electrons in a quantum dot in order to manipulate their states. It is also common to use a plurality of quantum dots to perform more complex operations. In general, the potential at each quantum dot is modulated by means of a first gate, referred to as the front gate hereinafter, while the coupling between the two quantum dots (in other words, the potential height between two quantum dots) is modulated by a second gate, referred to as the exchange gate hereinafter. The electrostatic potential thus obtained is illustrated in FIG. 1 in the case of a first quantum dot and a second quantum dot separated from each other by a potential barrier, the height of the potential barrier (and thus the coupling between the two quantum dots) being modulated using the exchange gate. Thus, the devices used are generally in the form of the device described in document WO2017213658, visible in FIG. 2A (side view) and FIG. 2B (top view). In these figures, the references 110 correspond to the front gates while the references 112 correspond to the exchange gates. Furthermore, the front gates are contacted using a first series of electrodes referenced 120 while the exchange gates are contacted using a second series of electrodes referenced 122. In FIG. 2A, reference 102 corresponds to the base, reference 104 corresponds to fins, reference 121 corresponds to a magnetic line, reference 123 corresponds to conductive vias, reference 130 corresponds to the insulating material, reference 136 corresponds to conductive vias, reference 140 corresponds to a doped region. In FIG. 2B, references 106-1, 106-2, 106-3, 108-1, 108-2, 108-3 and 142 correspond electron-type quantum dots.

However, the method for manufacturing such a device provided in this document has two drawbacks. Firstly, the absence of a short circuit between the front gates and the exchange gates relies solely on the quality of the alignment of the contacts and the gates. There is therefore a high risk of short-circuit in case of misalignment. In order to reduce this risk, as illustrated in FIG. 2B, the first series and second series of electrodes are offset from the axis of alignment of the front and exchange gates in order to limit the risk of short circuits between the exchange gates and the front gates. The surface area occupied by a device thus obtained is therefore relatively large, which reduces accordingly the density of devices that can be achieved.

More generally, the examination of the state of the art shows that the provided solutions involve complex manufacturing methods including a large number of chemical mechanical polishing steps (for example WO2017213658) and have high risks of short circuits between the front gates and the exchange gates requiring the adoption of an offset reconnection for the front gates and the exchange gates.

There is therefore a need to provide a method that reduces the risk of short circuits between the front gates and exchange gates. There is also a need to provide a method for reducing the surface area occupied by a device likely to be used for forming coupled quantum dots.

SUMMARY OF THE INVENTION

The invention provides a solution to the above-mentioned problems, by making it possible to obtain exchange gates that are self-aligned with the front gates, thus drastically reducing the risks of short circuits between the gates. Furthermore, in the method according to the invention, the electrical contacts associated with the exchange gates are not offset, reducing the surface area occupied by the device thus obtained.

One aspect of the invention relates to a method for manufacturing self-aligned exchange gates from a starting structure including a substrate and, disposed on the substrate, a plurality of gate stacks, each gate stack comprising a layer of a conductive or semiconductor material as well as a layer of a hard mask, the method comprising:
- a step of conformally depositing a liner layer on the starting structure;
- a step of conformally depositing a layer of a spacer material on the liner layer, the thickness of the layer of spacer material being chosen so as to fill the space between the gate stacks; and
- a step of anisotropic etching the layer of spacer material;
- a step of anisotropic etching the liner layer; and
- a step of depositing a stop layer on the whole intermediate structure obtained at the end of the previous steps;
- a step of depositing an encapsulation layer on the stop layer; and
- a first photolithography step so as to make, in the stop layer and the encapsulation layer, the apertures opening at the gate stacks, the apertures being intended to receive electrical contacts;
- a step of depositing a protective layer so as to protect the zones exposed during the first photolithography step;
- a second photolithography step making apertures exposing the layer of a spacer material located between the gate stacks;
- a step of selectively etching the layer of spacer material exposed during the previous photolithography step; and
- a step of forming contacts in the apertures made during the first photolithography step, the second photolithography step and the step of selectively etching the layer of spacer material so as to obtain the exchange gates.

By virtue of the invention, it is possible to obtain exchange gates that are self-aligned with the front gates, thus greatly reducing the risk of short circuits. Furthermore, the contacts of the exchange gates are not offset but are made directly above the exchange gates, which reduces the surface area of the device thus obtained.

In addition to the characteristics just mentioned in the previous paragraph, the method according to a first aspect of the invention may have one or more of the following additional characteristics, considered individually or in any technically possible combination.

In one embodiment, the layer of conductive or semiconductor material is of degenerate semiconductor, for example polysilicon, and the method further comprises, after the step of anisotropic etching the liner layer:

A step of etching the layer of hard mask;

A step of siliciding the layer of semiconductor material.

In one embodiment, the method comprises, after the step of anisotropic etching the liner layer, a step of depositing or growing a layer of dopant reservoir material so as to form the dopant reservoirs, the apertures made during the first photolithography step also opening onto the dopant reservoirs.

Hereinafter, when the deposition relates to the dopant reservoir material, the term deposition may also refer to growth, even when such precision is not provided.

In one embodiment, the method comprises, at the end of the first lithography step and before the step of depositing a protective layer, a step of forming contacts in the apertures made during the first lithography step.

In one embodiment, in the contact forming step, contacts are also formed in the apertures made during the first lithography step.

In one embodiment, the thickness of the layer of a hard mask is equal to twice the thickness of the layer of conductive or semiconductor material.

In one embodiment, the first lithography step comprises:
a sub-step of etching the encapsulation layer to the stop layer; and
a sub-step of etching the stop layer.

In one embodiment, the second photolithography step comprises:
a sub-step of etching the protective layer and the encapsulation layer to the stop layer; and
a sub-step of etching the stop layer.

In one embodiment, the method comprises, after the step of depositing an encapsulation layer, a chemical mechanical polishing step.

In one embodiment, the gate stacks are aligned along a reference axis and the apertures opening at the stacks made during the first photolithography step are offset from the reference axis.

In one embodiment, the spacer material is boron nitride or aluminium oxide.

In one embodiment, during the step of selectively etching the layer of spacer material, the spacer material is etched at least five times faster than the other materials present.

In one embodiment, during the step of anisotropic etching the spacer material layer, the etching stop occurs on the liner layer.

A second aspect of the invention relates to a semiconducting device comprising a first oxide layer, referred to as a layer of buried oxide, a layer of silicon, a first and a second dopant reservoir, a plurality of front gates horizontally aligned between the first and the second dopant reservoir, each front gate including a layer of conductive or semiconductor material, a layer of oxide, the layer of oxide being located between the layer of conductive or semiconductor material and the layer of silicon, a plurality of exchange gates, each exchange gate being located between two front gates of the plurality of front gates, each exchange gate including a layer of conductive material, a layer of oxide, the layer of oxide being located between the layer of silicon and the layer of conductive or semiconductor material on the one hand and between the exchange gate considered and the two front gates located on either side of the exchange gate considered, the device further comprising a plurality of electrical contacts, each electrical contact of the plurality of electrical contacts being connected to an exchange gate and each electrical contact of the plurality of electrical contacts being located above the exchange gate to which it is connected.

Advantageously, the alignment axis is a first alignment axis, the device further comprising a second plurality of front gates aligned horizontally along a second alignment axis parallel to the first alignment axis between the first and the second dopant reservoir, each front gate of the second plurality of front gates including a layer of conductive or semiconductor material, a layer of oxide, the layer of oxide being located between the layer of conductive or semiconductor material and the layer of silicon, each exchange gate is located between two front gates of the second plurality of front gates, the layer of oxide of the exchange gate being located between the exchange gate considered and the two front gates of the second plurality of front gates located on either side of the exchange gate considered.

The invention and its various applications will be better understood upon reading the following description and upon examining the accompanying figures.

BRIEF DESCRIPTION OF THE FIGURES

The figures are set forth by way of indicating and in no way limiting purposes of the invention.

FIG. 1 shows the operating principle of two quantum dots separated by a potential barrier.

FIG. 2A and FIG. 2B illustrate a device obtained by a method according to the state of the art.

FIG. 3 shows a logic diagram of a method according to the invention.

FIG. 4 shows the starting structure of the method according to the invention.

FIG. 5 shows the structure obtained at the end of the step of conformally depositing a liner layer.

FIG. 6 shows the structure obtained at the end of the step of conformally depositing a layer of spacer material.

FIG. 7 shows the structure obtained at the end of the step of dry etching the spacer layer.

FIG. 8 shows the structure obtained at the end of the step of depositing or growing a layer of dopant reservoir material.

FIG. 9 shows the structure obtained at the end of the step of etching the layer of hard mask.

FIG. 10 shows the structure obtained at the end of the silicidation step.

FIG. 11 shows the structure obtained at the end of the step of depositing a stop layer.

FIG. 12 shows the structure obtained at the end of the step of depositing and planarizing an encapsulation layer.

FIG. 13 shows an aperture made so that the dopant reservoirs can be electrically contacted.

FIG. 14A shows the position of the contacts connecting the front gates and the contacts connecting the dopant reservoirs in a first embodiment.

FIG. 14B shows the position of the contacts connecting the front gates and the contacts connecting the dopant reservoirs in a second embodiment.

FIG. 15A shows the structure obtained at the end of the second lithography step at the gate stacks.

FIG. 15B shows the structure obtained at the end of the second lithography step at the contacts of the dopant reservoirs.

FIG. 16 shows the structure obtained at the end of the step of selectively etching the spacer material layer.

FIG. 17A shows the structure obtained at the end of the step of depositing the contacts made during the first and second lithography steps at the gate stacks.

FIG. 17B shows the structure obtained at the end of the step of depositing the contacts made during the first and second lithography steps at the contacts of the dopant reservoirs.

FIG. 18 shows a side view of the device likely to be obtained using a method according to the invention.

FIG. 19A and FIG. 19B show a top view of the device likely to be obtained using a method according to the invention.

DETAILED DESCRIPTION

Unless otherwise specified, a same element appearing in different figures has a unique reference.

Starting Structure

A first aspect of the invention illustrated in FIG. 3 relates to a method 100 for manufacturing self-aligned exchange gates. This method 100 is carried out from the structure illustrated in FIG. 4. This structure comprises a substrate which, in one embodiment which will serve to illustrate the invention, comprises a first layer of oxide BOX, referred to as a layer of buried oxide, a layer of silicon SI on the first layer of oxide BOX and a second layer of silicon oxide OX on the layer of silicon SI. Of course, other types of substrate may be used. The structure further includes, disposed on the substrate (and thus, in the figures, on the second layer of silicon oxide OX), a plurality of gate stacks intended to form the front gates, each gate stack comprising a layer of conductive or semiconductor material MC (including, for example, polysilicon, titanium nitride and/or a metal such as tungsten, for example in the form of several sub-layers, the layer of conductive or semiconductor material MC may thus comprise one or more sub-layers of conductive and/or semiconductor materials) as well as a layer of a hard mask MD (for example silicon nitride, silicon oxide). In one embodiment, the gate stack also comprises a layer BA of a metal determining the work function of the gate (for example to define the threshold voltage of the device) known as work function metal. Thus, the second layer of silicon oxide OX constitutes the gate oxide of the gate stack and it is in the layer of silicon SI under this second layer of oxide OX that the active zone ZA associated with each gate stack is formed.

In one embodiment, the thickness of the layer of hard mask MD is equal to twice the thickness of the conductive or semiconductor material layer MC, for example 40 nm for a thickness of conductive or semiconductor material MC of 20 nm. This choice in the thicknesses of the layer of hard mask MD and the layer of conductive or semiconductor material MC makes it possible to maintain an advantageous topology for the manufacturing steps that will be described hereinafter.

The etching steps for obtaining such a starting structure are known to the person skilled in the art. Generally, the layer of hard mask MD is etched using $CF_4$ and $CH_2F_2/SF_6$ when this layer is made of silicon oxide or silicon nitride. The conductive or semiconductor material layer MC is etched using HBr when this layer comprises a sub-layer of polysilicon and/or using $SiCl_2/Cl_4$ when this layer comprises a sub-layer of titanium nitride. However, these are only examples and the person skilled in the art will be able to adapt the etching method to the materials used for the different layers.

Deposition of a Bilayer Spacer

As illustrated in FIG. 5, the method 100 according to a first aspect of the invention comprises a step E1 of conformally depositing a liner layer LI, for example a layer of SiN, SiBCN or even SiOCN. The deposition may for example be performed by an ALD (Atomic Layer Deposition) method. In one embodiment, the thickness of the liner layer LI is between 4 nm and 5 nm. As will be detailed hereinafter, this liner layer LI will constitute, at the end of the method 100 according to the invention, the spacer between the front gates and the exchange gates that the method 100 according to the invention makes it possible to obtain, as well as the layer of oxide separating each exchange gate from the layer of silicon SI.

As illustrated in FIG. 6, the method 100 according to a first aspect of the invention then comprises a step E2 of conformally depositing a layer of a spacer material ME, for example silicon oxide or another material that can be etched selectively with respect to the liner LI and the future encapsulation layer CE, the thickness of the layer of a spacer material ME being chosen so as to fill the space between the gate stacks. For example, if the distance between two gate stacks is equal to 40 nm, then the thickness of the layer of spacer material ME may be chosen to be greater than 20 nm, for example equal to 25 nm.

At the end of these two steps E1, E2, a bilayer spacer is formed between the gate stacks.

Etching of the Bilayer Spacer

In order to keep the bilayer spacer only between the gate stacks, the method according to a first aspect of the invention comprises a step E3 of anisotropic etching, for example dry etching, the spacer material layer ME, the etching stop occurring on the liner layer LI. The method 100 then comprises a step E4 of anisotropic etching, for example dry etching, the liner layer LI. In one embodiment, the etching stop occurs on the second layer of silicon oxide OX, however, this latter layer may be consumed during this etching step E4. When this layer is not consumed during this etching step E4, it can for example be removed during the pre-epitaxial surface preparations of the reservoirs, for example with a SiCoNi and or diluted HF based method. In one embodiment, these two etching steps E3,E4 are performed by a fluorocarbon plasma method.

The structure obtained at the end of these two steps E3,E4 is illustrated in FIG. 7 for the case where the layer of silicon oxide OX was also consumed during the step E4 of etching the liner layer LI.

Creation of Dopant Reservoirs (Optional)

In one embodiment, the method according to the invention then comprises a step E5 of depositing or growing a layer of a dopant reservoir material, for example Si:P (P-doped silicon) in the case where the charges are electrons and SiGe:B (boron-doped silicon germanium alloy) in the case where the charges are holes. However, this step is optional, as the formation of the reservoirs may occur later, for example at the end of the implementation of the method 100 according to the invention by implantation. In one embodiment, this deposition or growth step E5 is an epitaxial growth step and is preferably preceded by a step for preparing the surface. Preferably, when the layer of spacer material ME is of silicon oxide, the preparation of the surface before epitaxy will be adjusted so as to limit the consumption of the silicon oxide. When the deposition is performed by epitaxy, the precursors can be chosen from $SiH_4$, $SiH_2Cl_2$, $GeH_4$, the temperature during the epitaxy being preferably between 650° C. and 750° C. In one embodiment, the thickness of the layer of a dopant reservoir material is between 15 nm and 30 nm, preferably equal to 20 nm. The structure obtained at the end of this step E5 is illustrated in FIG. 8 where the dopant reservoirs are integrated in the layer of silicon SI.

Removal of the Hard Mask MD from the Date Stacks (Optional)

In one embodiment, when the layer of conductive or semiconductor material MC is a layer of degenerate semiconductor, for example polysilicon, the method 100 according to the invention comprises a step E6 of etching the layer of hard mask MD. Preferably, the liner layer LI surrounding the layer of hard mask MD is also etched during this step E6. In one embodiment, this etching step E6 is a wet etching step. For example, if the layer of hard mask MD is of silicon nitride, the etching step E6 can be performed using an $H_3PO_4$ solution, preferably at a temperature of 100° C., the etching time being adjusted according to the thickness of the layer of hard mask MD. The structure obtained at the end of this step E6 is illustrated in FIG. 9 in the case where the liner layer LI is also etched during this step E6. In contrast, this step E6 is optional if the conductive or semiconductor material MC is a metal (in other words if the front gates obtained from the gate stacks are so-called metal gates).

Silicidation of the Date Stacks and Dopant Reservoirs (Optional)

When the method comprises a step E5 of depositing or growing a layer of a dopant reservoir material and/or a step E6 of etching the layer of hard mask MD, the method 100 according to the invention comprises a step E7 of siliciding the layer of a dopant reservoir material and/or siliciding the layer of the semiconductor material MC. In one embodiment, the silicidation step implements a method well known to the person skilled in the art (called "salicidation") comprising a sub-step of metal deposition (for example NiPt10%), an encapsulation sub-step (for example with TiN), a first annealing sub-step, a sub-step of removing unreacted metal, and a second annealing sub-step (the silicided portion is denoted as SC in the figures). In one embodiment, when the layer of conductive or semiconductor material MC is of degenerate semiconductor, for example polysilicon, the thickness of silicide obtained is preferably equal to half the thickness of the layer of semiconductor material MC (for example between 10 nm and 15 nm). The structure obtained at the end of this step E7 is illustrated in FIG. 10 in the case where the step E5 of depositing or growing a layer of a dopant reservoir material and the step E6 of etching the layer of hard mask MD are implemented.

Encapsulation

The method according to the invention then comprises a step E8 of depositing a stop layer CA (for example a CESL for "Contact Etch Stop Layer") on the whole intermediate structure obtained at the end of the previous steps. In one embodiment, this deposition step E8 is a step 8 of PECVD (Plasma-Enhanced Chemical Vapor Deposition) deposition. In one embodiment, the thickness of the stop layer CA is between 20 nm and 40 nm. The structure obtained at the end of this step is illustrated in FIG. 11.

The method according to the invention then comprises a step E9 of depositing an encapsulation layer CE, for example a PMD (Poly-metal dielectric) encapsulation oxide. In one embodiment, the encapsulation oxide is TEOS (tetraethyl orthosilicate). In one embodiment, the thickness of the encapsulation layer CE is between 200 nm and 350 nm, preferably 300 nm.

In one embodiment, the method also comprises a step E10 of chemical mechanical polishing so as to ensure good planarization of the encapsulation surface.

The structure obtained at the end of this step E10 is illustrated in FIG. 12.

Pattern of Contacts for Date Stacks and Dopant Reservoirs

The method according to the invention then comprises a first photolithography step E11 so as to make the apertures OSD, OSC intended to receive the electrical contacts of the gate stacks and at the dopant reservoirs when and if the latter have been formed during a previous step (the creation of these reservoirs being optional). In one embodiment, the first lithography step E11 comprises a sub-step of etching the encapsulation layer CE to the stop layer CA and then a sub-step of etching the stop layer CA. In one embodiment, the etching sub-steps are plasma etching sub-steps, preferably in fluorocarbon chemistry. FIG. 13 illustrates an aperture OSD made to connect a dopant reservoir. A similar aperture OSC is made for each gate stack to contact the layer of conductive or semiconductor (made conductive by silicidation) material MC of each gate stack.

As illustrated in FIG. 14A (in this figure as well as in FIG. 14B only the layers relating to the conductive or semiconductor material MC, spacer material ME and silicon SI are represented for readability reasons), the apertures OSD for the contacts of the dopant reservoirs are made in the extension of the horizontal alignment axis AG of the gate stacks. In contrast, the apertures OSC for the contacts of the gate stacks are offset from the alignment axis AG of the gate stacks.

As illustrated in FIG. 14B, it is possible to have the layer of silicon in common with a first plurality of gate stacks along a first horizontal alignment axis AG1 and a second plurality of gate stacks along a second horizontal axis AG2 parallel to the first alignment axis AG1. In this embodiment, the apertures OSD allowing the formation of the contacts of the dopant reservoirs are made in the extension of a third horizontal alignment axis AG3, located between the first alignment axis AG1 and the second alignment axis AG2 and parallel to these two axes. In contrast, the apertures OSC for the contacts of the gate stacks are offset from the alignment axis AG1, AG2 of their respective gate stacks.

In one embodiment, by "offset" it is meant that the apertures OSC for allowing the formation of the contacts of the gate stacks (and thus the resulting contacts) are not located above the active zones ZA associated with said gate stacks. In one embodiment, by "offset" it is meant that the apertures OSC for allowing the formation of the contacts of gate stacks (and thus the resulting contacts) are not located above the layer of silicon SI on which said stacks are made. By extension, an electrical contact is said to be offset when it is not located above the active part of the element it connects.

As will be detailed hereinafter, the layer of spacer material ME will be replaced by electrodes, preferably of metal, so as to form a plurality of exchange gates GE. Thus, unlike the contacts of the front gates, the contacts of the exchange gates, at the end of the method 100 according to the invention, will be located directly above the exchange gates GE.

Pattern of Contacts for the Exchange Gates GE

The method then comprises a step E12 of depositing a protective layer CP, for example a so-called SOC (Spin-on-Carbon) layer, in order to protect the zones exposed by the apertures made during the first photolithography step E11. The method 100 then comprises a second photolithography step E13 so as to make apertures exposing the layer of a spacer material ME located between the gate stacks. In one embodiment, the second photolithography step E13 comprises a sub-step of etching the protective layer CP and the encapsulation layer CE to the stop layer CA and then a sub-step of etching the stop layer CA. In one embodiment, the etching sub-steps are dry etching sub-steps (for example plasma) with a fluorocarbon chemistry. The structure obtained at the end of this step E13 is illustrated in FIG. 15A for the zone relating to the gate stacks and in FIG. 15B for the zone relating to the apertures of the contacts for the dopant reservoirs.

Pattern of the Exchange Gates (Self-Aligned)

The method according to the invention then comprises a step E14 of selectively etching the layer of a spacer material ME exposed during the previous photolithography step E13. By selective etching it is meant that the spacer material ME is etched faster, for example at least five times faster, preferably at least ten times faster, than the other materials present, and in particular faster than the liner layer LI, the stop layer CA or the encapsulation layer CE.

In one embodiment, the spacer material ME is boron nitride (BN) and the etching step E14 is a dry etching step, preferably carried out in fluorocarbon chemistry, for example an etching step similar to the etching of the encapsulation layer CE. In an alternative embodiment, the material of the spacer ME is aluminium oxide ($AlO_x$).

In one embodiment, the spacer material ME is silicon oxide and the selective etching step E14 is a wet etching step, for example 1% HF etching. In this embodiment, the etching step E14 is preceded by a step of conformally depositing a protective layer, for example a layer of silicon nitride or polysilicon, followed by a step of anisotropic etching (similar to that used for etching the gate stacks) the protective layer so as to keep the protective layer only on the flanks of the apertures made during the first photolithography step E11. The structure obtained at the end of these steps is illustrated in FIG. 16. It is useful to note that obtaining the apertures that will form the exchange gates does not require precise alignment during the second lithography step E13, the zones for forming the exchange gates located between the stacks of front gates being obtained by self-alignment during the step E14 of selectively etching the layer of spacer material ME. The method 100 according to the invention guarantees very good control of the position of the exchange gates GE and considerably reduces the risks of short-circuit between the exchange gates and the stacks of gates GP.

Order in Patterning

In the above, patterning of the contacts for the gate stacks and dopant reservoirs is implemented before patterning of the contacts for the exchange gates GE and patterning for the exchange gates. However, the order of these steps can be reversed so that patterning of the contacts for the exchange gates GE and patterning of the exchange gates can be implemented before patterning of the contacts for the gate stacks and the dopant reservoirs. Also, in interpreting the method according to the invention, the order of these steps should not be understood as limiting.

Contacts

In one embodiment, the method 100 then comprises a step E15 of depositing the contacts in the apertures made during the first step E11 and second E13 lithography steps and the step E14 of selectively etching the layer of spacer material ME. In one embodiment, the step E15 of depositing the contact CT comprises a sub-step of conformally depositing an adhesion layer, for example of titanium, a sub-step of conformally depositing a layer of a barrier material, for example titanium nitride, and a sub-step of conformally depositing a conductive material, for example tungsten, so as to completely fill the apertures made previously. In one embodiment, the method also includes a chemical mechanical polishing step E16.

In an alternative embodiment, the method 100 comprises a step of depositing contacts at the end of the first lithography step E11 during which the contacts relating to the reservoirs and gate stacks are made, these contacts then being covered by the protective layer CP during the step E12 of depositing a protective layer. The method also comprises a second step of depositing the contacts at the end of the second photolithography step E13 in the apertures made during this step E13.

The structure obtained at the end of this step is illustrated in FIG. 17A for zones relating to the gate stacks and in FIG. 17B for the zone relating to the apertures of the contacts for the dopant reservoirs. In this structure, no exchange gate GE is present between the dopant reservoirs SD and the front gate GP closest to said reservoirs SD. However, this is only a particular embodiment, and it is also possible to form an exchange gate GE for each dopant reservoir SD using a method according to the invention, separating the dopant reservoir SD from the closest front gate GP.

Semiconducting Device

A second aspect of the invention illustrated in FIGS. 18, 19A and 19B (in FIGS. 19A and 19B, only the layers relating to the conductive or semiconductor material MC, silicon SI and contact CT are represented for readability reasons) relates to a semiconducting device DI likely to be obtained by a method according to the invention. The semiconducting device DI according to the invention comprises a first layer of oxide BOX, referred to as layer of buried oxide, a layer of silicon SI as well as a first and a second dopant reservoir SD. The device DI according to the invention also comprises a plurality of front gates GP aligned horizontally along an alignment axis AG between the first and the second dopant reservoir SD, each front gate GP including a layer of a conductive or semiconductor material MC, a layer of oxide OX, the layer of oxide OX being located between the layer of conductive or semiconductor material MC and the layer of silicon SI. The device according to the invention further comprises a plurality of exchange gates GE, each exchange gate being located between two front gates GP of the plurality of front gates GP, each exchange gate including a layer of a conductive material, a layer of oxide LI, the layer of oxide LI being located between the layer of silicon SI and the layer of conductive or semiconductor material MC on the one hand and between the exchange gate GE considered and the two front gates GP located on either side of the exchange gate GE considered.

In one embodiment illustrated in FIG. 19B, the device also comprises a second plurality of front gates GP aligned horizontally along a second alignment axis AG2 parallel to the first alignment axis AG1 between the first and the second dopant reservoir SD, each front gate GP including a layer of a conductive or semiconductor material MC, a layer of oxide OX, the layer of oxide OX being located between the layer of conductive or semiconductor material MC and the layer of silicon SI. Furthermore, each exchange gate is located between two front gates GP of the second plurality of front gates GP, the layer of oxide LI being located between the exchange gate GE considered and the two front gates GP of the second plurality of front gates GP located on either side of the exchange gate GE considered.

In one embodiment, the device comprises a plurality of electrical contacts, each electrical contact of the plurality of electrical contacts being connected to an exchange gate GE, each electrical contact of the plurality of electrical contacts being located above the active zone of the exchange gate GE to which it is connected. In other words, the electrical contacts associated with the exchange gates are not offset, but are located above said exchange gates, thereby increasing the density of devices.

In the device illustrated in the figures, no exchange gate GE is present between the dopant reservoirs SD and the front gate GP closest to said reservoirs SD. However, this is only a particular embodiment and the device according to the invention may also comprise, for each dopant reservoir SD, an exchange gate GE separating the dopant reservoir SD from the closest front gate GP.

The invention claimed is:

1. A method for manufacturing exchange gates from a starting structure comprising a substrate and, disposed on the substrate, a plurality of gate stacks, each gate stack comprising a layer of a conductive or semiconductor material and a layer of a hard mask, the method comprising:
   a step of conformally depositing a liner layer on the starting structure;
   a step of conformally depositing a layer of a spacer material on the liner layer, the thickness of the layer of a spacer material being chosen so as to fill the space between the gate stacks;
   a step of anisotropic etching the layer of spacer material;
   a step of anisotropic etching the liner layer;
   a step of depositing a stop layer on a whole intermediate structure obtained at the end of the previous steps;
   a step of depositing an encapsulation layer on the stop layer;
   a first photolithography step so as to make, in the stop layer and the encapsulation layer, apertures opening at the gate stacks, the apertures being intended to receive electrical contacts;
   a step of depositing a protective layer so as to protect zones exposed during the first lithography step;
   a second photolithography step making apertures exposing the layer of a spacer material located between the gate stacks;
   a step of selectively etching the layer of spacer material exposed during the second photolithography step; and
   a step of forming the contacts in the apertures made during the first photolithography step, the second photolithography step and the step of selectively etching the layer of spacer material so as to obtain the exchange gates.

2. The method according to claim 1, wherein the layer of conductive or semiconductor material is of degenerate semiconductor, the method further comprising, after the step of anisotropic etching the liner layer:
   a step of etching the layer of hard mask, the layer of semiconductor material;
   a step of siliciding the layer of semiconductor material.

3. The method according to claim 1, comprising, after the step of anisotropic etching the liner layer, a step of depositing or growing a layer of dopant reservoir material so as to form dopant reservoirs, the apertures made during the first photolithography step also opening onto the dopant reservoirs.

4. The method according to claim 1, wherein a thickness of the layer of a hard mask is equal to twice a thickness of the layer of a conductive or semiconductor material.

5. The method according to claim 1, wherein the first lithography step comprises:
   a sub-step of etching the encapsulation layer to the stop layer; and
   a sub-step of etching the stop layer.

6. The method according to claim 1, wherein the second photolithography step comprises:
   a sub-step of etching the protective layer and the encapsulation layer to the stop layer; and
   a sub-step of etching the stop layer.

7. The method according to claim 1, comprising, after the step of depositing an encapsulation layer, a chemical mechanical polishing step.

8. The method according to claim 1, wherein the gate stacks are aligned along a reference axis and wherein the apertures opening at the stacks made during the first photolithography step are offset from the reference axis.

9. The method according to claim 1, wherein the spacer material is boron nitride or aluminum oxide.

10. The method according to claim 1, wherein, in the step of selectively etching the layer of spacer material, the spacer material is etched at least five times faster than the other materials present.

* * * * *